June 2, 1959 A. S. EPSTEIN 2,888,782

MOLD FOR FABRICATING OF SEMICONDUCTOR SIGNAL TRANSLATING DEVICES

Filed April 6, 1956 2 Sheets-Sheet 1

INVENTOR
ARNOLD S. EPSTEIN
BY Henry Kolin
AGENT

June 2, 1959 A. S. EPSTEIN 2,888,782

MOLD FOR FABRICATING OF SEMICONDUCTOR SIGNAL TRANSLATING DEVICES

Filed April 6, 1956 2 Sheets-Sheet 2

INVENTOR
ARNOLD S. EPSTEIN
BY Henry Kolin
AGENT

United States Patent Office
2,888,782
Patented June 2, 1959

2,888,782

MOLD FOR FABRICATING OF SEMICONDUCTOR SIGNAL TRANSLATING DEVICES

Arnold S. Epstein, Belleville, N.J., assignor to International Telephone and Telegraph Corporation, Nutley, N.J., a corporation of Maryland Application April 6, 1956, Serial No. 576,694

8 Claims. (Cl. 49—66)

This invention relates to semiconductor signal translating devices and more particularly to methods for fabricating such devices, such as alloy-junction transistors, and means used therefor.

Transistors of the alloy-junction type comprise, in general, a bar or wafer of semiconductive material, for example, germanium or silicon, having on opposite faces thereof juxtaposed zones of the opposite conductivity type forming rectifying junctions. Alloy-junction transistors of this type are designated as n-p-n or p-n-p transistors. As is known, a positive or p-type semiconductor is characterized by a predominance of positive conduction carriers or holes (deficiency of electrons) and may be formed by treating the semiconductive material with one or more impurity materials of the acceptor class. Impurities of this class include such materials as boron, aluminum, gallium and indium or alloys thereof. Negative or n-type germanium or silicon is characterized by a predominance of negative conduction carriers or electrons and may be formed by treating the semiconductive material with impurity materials of the donor class. Donor impurities include such materials as phosphorus, arsenic and antimony. These donor and acceptor impurities effectively serve to alter the conductivity and conductivity type of the semiconductive material. A well-known alloy junction of the p-n-p type consists of semiconductive germanium having pure indium or indium alloys fused on opposing faces thereof.

Present methods of alloying transistors do not readily permit the manufacture of large quantities of transistors in a simple and economical manner. It is an object therefore of the present invention to provide a simple novel method for forming an alloy-junction transistor.

It is a further object to provide a method particularly suitable for fabricating a plurality of semiconductor signal translating devices in a simultaneous operation.

It is still a further object to provide novel means for fabricating an alloy-junction transistor. It is an additional object to provide novel means for simultaneously fabricating a plurality of semiconductor signal translating devices.

It is an important feature of this invention that a mold is provided for fabricating a semiconductor signal translating device wherein a molten impurity body is caused to alloy in a simultaneous operation with opposing faces of a semiconductive material.

It is still a further feature that spaced-apart orifices are disposed on opposing walls of the mold so that a plurality of semiconductor signal translating devices may be fabricated in a simultaneous operation by flowing molten impurity material to the orifices to alloy with the adjacent surfaces of the semiconductive material.

Further objects, features and advantages of the invention may be better understood by reference to the following description taken in connection with the accompanying drawings, wherein.

Figure 1:
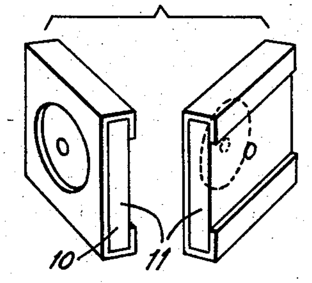
Fig. 1 is a perspective view showing opposite sides of a signal translating unit within a holder therefor.
Figure 2:
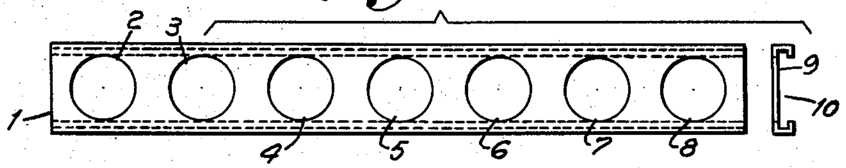
Fig. 2 shows elevational and end views of a holder for semiconductive material.

Referring to Figs. 1 and 2, a holder 1 is formed from a nickel strip which is tinned completely on one side and is punched to provide a series of holes or openings 2 to 8. For convenience, these openings are preferably regularly spaced apart. The tinned side 9 of the nickel strip is folded inwardly and with the ends folded toward each other to provide a channel 10 so that the inner surface of the channel is the tinned one. A slice of a highly pure crystal of semiconductive material 11, which just fits into the channel 10, is inserted from one end of the holder. The semiconductive material, such as crystalline germanium or silicon, is suitably treated by etching and washing prior to insertion in the holder 1, as is well known in this art. If desired, several pieces of semiconductive material may be inserted in the unitary holder. The openings 2 and 8 are of a convenient size to allow alloying.

Figure 3:
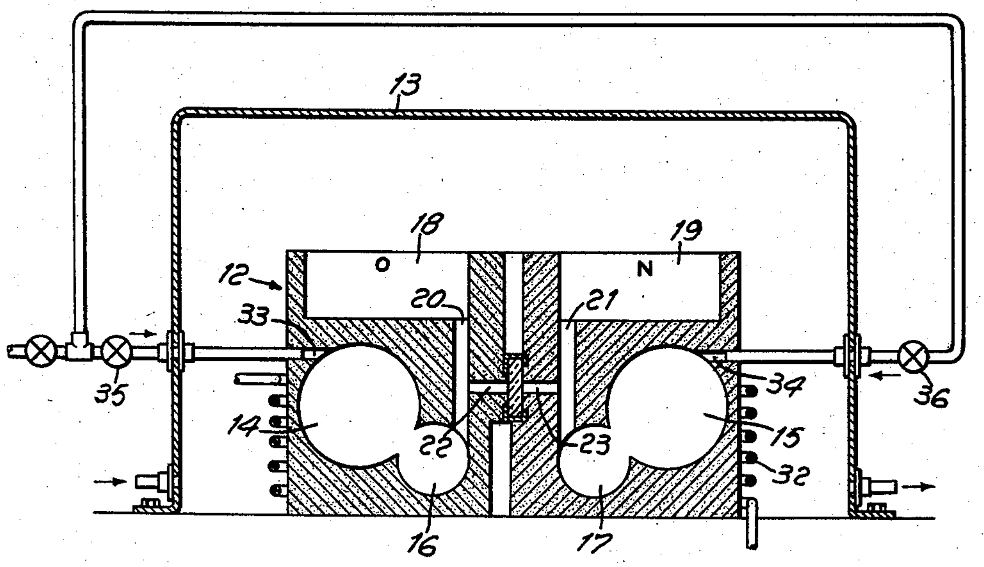
Fig. 3 is a sectional view showing the mold of this invention within a furnace.

Referring to Fig. 3, a vertical sectional view is seen of the nickel strip holder 1 and crystal 11 positioned in the mold 12. The use of a tinned nickel holder facilitates the fabrication of the semiconductive signal device, although the germanium bar may conceivably be alloyed without use of such a holder. The holder 1 can be introduced by a conveyor (not shown) into an evacuated furnace 13 which may be filled with hydrogen or some other inert gas non-reactive to the material of the mold, the semiconductive element and the alloying impurity. Where germanium is used as the semiconductive material, it is preferred to make the mold of carbon. Chambers 14 and 15 are provided in the mold. Smaller chambers 16 and 17 interconnect with chambers 14 and 15, respectively. These chambers 16 and 17 connect to respective overflow chambers or reservoirs 18 and 19 by means of drilled channels 20 and 21, respectively. The orifices of channels 22 and 23 are in contact with opposite sides of the holder, and these channels interconnect with chambers 16 and 17, respectively. A plurality of channels 22 is each individually provided to register with openings 2 to 8 so as to allow for subsequent alloying of the semiconductive material with the impurity material flowed through these channels. On the opposite sides of the semiconductive crystal, a similar plurality of channels 23 is provided, the orifices of these channels being preferably in alignment with the correspondingly positioned openings of holder 1, for also alloying with the semiconductive material.

Figure 4:
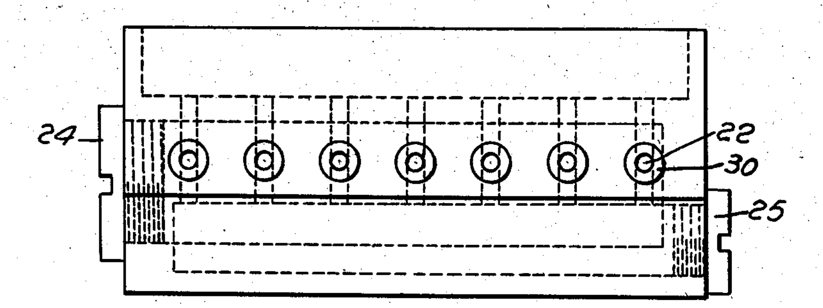
Fig. 4 is a front elevational view of the left-hand member of the mold shown in Fig. 3.
Figure 5:
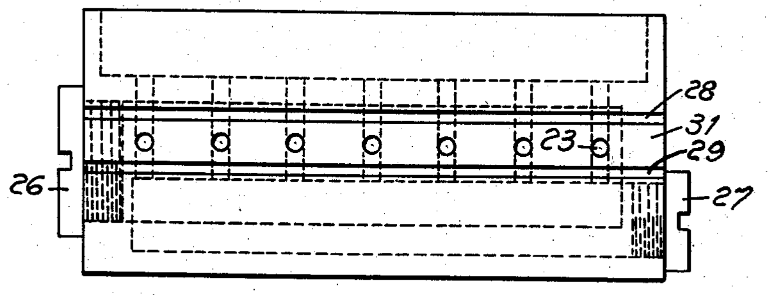
Fig. 5 is a front elevational view of the right-hand member of the mold shown in Fig. 3.

In Fig. 4 is shown an elevational view of the left-hand side of the alloying mold showing channels 22. End caps 24 and 25 allow for insertion of the impurity material into chambers 14 and 16. In a similar manner, as illustrated in Fig. 5, the right-hand alloying mold is shown. End caps 26 and 27 are used to provide access to chambers 15 and 17.

In practicing this invention, the holder is positioned in the mold such that a semiconductive material, such as germanium, is in contact with the orifices of channels 22 and 23. The grooves 28 and 29 shown in Fig. 5 make room for the holder edges which would otherwise interfere with closing of the mold. The mold sections are moved toward each other to clamp the germanium between the nozzles 30 and 31 and also to force the nickel holder into close contact with the germanium. Indium or an indium alloy which had been inserted in chambers 14 and 15 by removal of caps 24 and 26, respectively, is brought to a molten state. The molten indium or molten indium alloy is held at a temperature of 500° C. in the molds. The molds may be heated by either resistance elements or, as illustrated in Fig. 3, by induction heating coils 32. Channels 33 and 34 are provided communicating with chambers 14 and 15 so that gas under pressure may be introduced by opening valves 35 and 36, respectively, which are connected to a source of inert gas (not shown). Helium or hydrogen gas under pressure is forced into channels 33 and 34, the gas pressure then forcing a portion of the molten impurity body along channels 22 and 23. During the alloying process, the molten liquid impurity is forced up into overflow cavities 18 and 19, and the level is maintained for a given time to allow alloying to take place at both sides of the crystal. The amount of impurity body, such an indium, finally alloyed with the semiconductive material, such as germanium, is controlled by the size of the orifices of channels 22 and 23, by the reaction temperature used, and by the time of contact of the impurity material with the semiconductive material. After the set time for alloying has elapsed, the pressure at channels 33 and 34 is reduced permitting the unused liquid indium i.e., that portion which has not alloyed, to drain back from reservoirs 18 and 19 into chambers 16 and 17, respectively. Some indium, will, however, remain on the crystal surface to form a raised layer of indium on the germanium.

Figure 6:
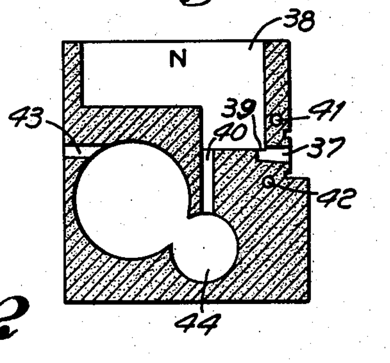
Fig. 6 is a sectional view of another embodiment of a mold for practicing this invention.

Thus, as described in the foregoing, in one simultaneous operation two p-n junctions have been formed, and the nickel holder has been soldered to the semiconductive material. Thereby, the essential requirements of a p-n-p transistor have been satisfied. In a similar manner, an n-p-n transistor may be formed by treating germanium with a molten donor impurity such as a lead-antimony alloy.

Where additional quantities of indium are required for contact purposes, a mold such as illustrated in Fig. 6 may be used to obtain this type of structure. Channel 37 is drilled only a short distance into the mold, and reservoir 38 is shaped to cut across the top of channel 37, at orifice 39. Channel 40 then terminates at this lower step instead of at the reservoir bottom as shown in the previous embodiment. Gas-cooling ducts 41 and 42 are provided to assist in temperature control and to cool down the alloyed junctions.

In practice, using the mold of Fig. 6, liquid indium would be forced up into reservoir 38 through channel 40 to fill channel 37 and thereby alloy with the germanium semiconductive body. Gas pressure is applied at channel 43 to force the liquid indium from chamber 44. Upon reduction of the gas pressure, some of the indium remains in the space in channel 37 and becomes firmly attached to the germanium when cool hydrogen is blown through cooling ducts 41 and 42. A relatively large mass of indium could thus be attached to the transistor and its shape readily controlled.

Figure 7:
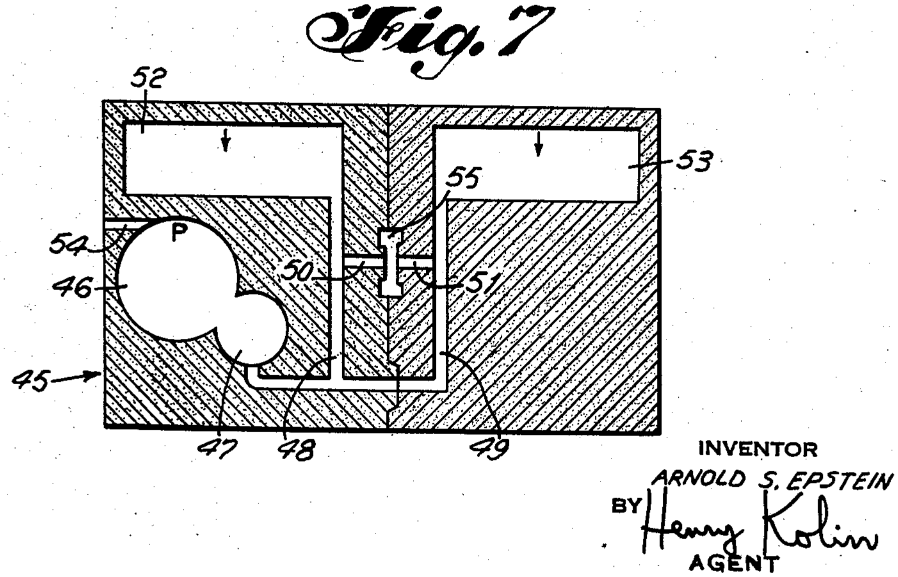
Fig. 7 is a sectional view of a further embodiment of a mold for practicing this invention.

In Fig. 7 is shown a sectional view of an additional embodiment of a mold 45 utilizing a single set of impurity chambers 46 and 47 communicating by means of channels 48 and 49 with channels 50 and 51, respectively, and overflow chambers 52 and 53, respectively. Channel 54 is used to introduce an inert gas for forcing molten indium in contact with opposite faces of the semiconductive crystal 55 positioned in the mold 45. In this mold embodiment, overflow chambers 52 and 53 may be sealed off at their upper extremity in order to build up a uniform pressure and level of molten impurity within the mold.

After alloying in a simultaneous manner a number of such junctions, the sandwich may then be cut up into individual transistors, as shown in Fig. 1, which may then be mounted and encapsulated. It is envisaged within the scope of this invention that the foregoing operation could include the direct attachment of electrical leads to the indium while the sample is being cooled down. Thus, in the foregoing technique, a continuous method has been provided whereby a strip, such as one of nickel, is formed, clamped over the semiconductive slices, such as germanium, fed through the alloying furnace and molds to simultaneously form completed junctions on both sides of the semiconductive bar and then removed to be sawed up or otherwise divided into individual transistor units. Thereby, a method has been provided which is particularly useful for the mass production in a convenient and ready manner of alloy-junction transistors of the p-n-p type and particularly adaptable for the formation of indium-germanium junctions, although not restricted thereto.

While I have described above the principles of my invention in connection with specific apparatus and processes, it is to be clearly understood that this description is made only by way of example and not as a limitation to the scope of my invention as set forth in the objects thereof and in the accompanying claims.

I claim:

1. A mold for fabricating a semiconductor signal translating device wherein a molten impurity body is caused to alloy in a simultaneous operation with opposing faces of a semiconductive material positioned within said mold comprising a pair of spaced walls adapted to receive therebetween a body of semiconductive material, each of said walls having an orifice therein across which said body is disposed when received between said walls, two interconnected impurity chambers for receiving a body of impurity material, means providing a channel communicating between one of said chambers and at least one of said orifices, an overflow chamber also communicating with said channel, and means for applying pressure within one of said chambers for causing molten impurity material contained within said impurity chambers to flow therefrom along said channel into at least one of said orifices and into said overflow chamber.

2. A mold for fabricating a semiconductor signal translating device wherein a molten impurity body is caused to alloy in a simultaneous operation with opposing faces of a semiconductive material positioned within said mold, comprising a pair of similar structures each having two interconnected impurity chambers therein for receiving a body of impurity material and having a wall opposing the wall of the other structure, each of said walls having at least an orifice, means providing a channel communicating between one of said impurity chambers and a corresponding one of said orifices, an overflow chamber also communicating with said channel, and means for introducing gas pressure to the other of said impurity chambers whereby molten impurity contained within said impurity chamber will be directed along said channel into an orifice and then into a corresponding overflow chamber.

3. An apparatus for fabricating a plurality of semiconductor signal translating devices wherein a molten impurity body is caused to alloy in a simultaneous operation with opposing faces of a semiconductive material contained within a holder receivable in a mold comprising, in combination, a holder for an elongated body of semiconductive material, said holder comprising a U-shaped member providing a channel for receiving said elongated semiconductive material, the base wall of said U-shaped member including a plurality of spaced-apart orifices therein; and a mold for receiving said holder in positioned relation thereto, said mold comprising a pair of similar structures each having an impurity chamber therein for receiving an impurity body, spaced-apart orifices disposed on opposing walls of said structures, the orifices in said holder being in corresponding alignment with orifices in at least one said wall when said holder is in predetermined positon in said mold, an overflow chamber in each said structure, channels communicating between each said impurity chamber, corresponding orifices and corresponding overflow chambers, and means for introducing gas pressure to said impurity chambers whereby molten impurity contained within said impurity chambers will be directed along said channels into said orifices and into said overflow chambers.

4. An apparatus according to claim 3, wherein each of said orifices in a given wall of one said structure is connected with individual channels each to one impurity chamber.

5. An apparatus according to claim 3, including means for bringing said mold to a temperature sufficient to melt said impurity body.

6. An apparatus according to claim 3, wherein portions of said channels communicating with said orifices are disposed in an upward relation with respect to said orifices so that molten impurity contained in said orifices cannot return to said overflow and impurity chambers.

7. An apparatus according to claim 3, wherein said molds further include ducts adjacent said semiconductive body for introducing a cooling fluid therein for rapidly cooling said semiconductive body.

8. A mold according to claim 2, wherein said overflow chambers are closed for obtaining a uniform pressure within said mold.

References Cited in the file of this patent

UNITED STATES PATENTS

| | | |
|---|---|---|
| 1,164,008 | Moore | Dec. 14, 1915 |
| 2,234,185 | Marinsky | Mar. 11, 1941 |
| 2,266,433 | Morin et al. | Dec. 16, 1941 |
| 2,756,483 | Wood | July 31, 1956 |
| 2,765,245 | English et al. | Oct. 2, 1956 |
| 2,779,877 | Lehovec | Jan. 29, 1957 |

FOREIGN PATENTS

| | | |
|---|---|---|
| 1,088,286 | France | Sept. 8, 1954 |